United States Patent
Okazaki et al.

(10) Patent No.: US 6,316,792 B1
(45) Date of Patent: *Nov. 13, 2001

(54) COMPOUND SEMICONDUCTOR LIGHT EMITTER AND A METHOD FOR MANUFACTURING THE SAME

(75) Inventors: Haruhiko Okazaki; Yukio Watanabe, both of Kanagawa-ken (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

This patent is subject to a terminal disclaimer.

(21) Appl. No.: 09/309,598

(22) Filed: May 11, 1999

Related U.S. Application Data

(62) Division of application No. 08/871,401, filed on Jun. 5, 1997, now Pat. No. 5,977,566.

(30) Foreign Application Priority Data

Jun. 5, 1996  (JP) ...................................... 8-142938
Dec. 9, 1996  (JP) ..................................... 8-328558

(51) Int. Cl.⁷ .......................... H01L 33/00; H01L 29/205
(52) U.S. Cl. ............................. 257/99; 257/103; 257/96; 257/97
(58) Field of Search ............................... 254/103, 96, 99, 254/97

(56) References Cited

U.S. PATENT DOCUMENTS

| | | |
|---|---|---|
| Re. 35,665 * | 11/1997 | Lin ......................................... 257/97 |
| 4,232,440 | 11/1980 | Bastek . |
| 4,495,514 | 1/1985 | Lawrence . |
| 5,122,844 | 6/1992 | Akiba et al. . |
| 5,696,389 | 12/1997 | Ishikawa . |
| 5,767,581 | 6/1998 | Nakamura . |

* cited by examiner

Primary Examiner—Jerome Jackson, Jr.
(74) Attorney, Agent, or Firm—Banner & Witcoff, Ltd.

(57) ABSTRACT

A compound semiconductor light emitting element includes a light emitting region formed by a pn-junction between a first compound semiconductor layer of a first conductivity type and a second compound semiconductor layer of a second conductivity type. A first electrode is connected to the first compound semiconductor layer and is isolated from the second compound semiconductor layer. A current spreading layer is formed on the second compound semiconductor layer and a block is formed on the second compound semiconductor layer. A second electrode is formed on the block and is connected to the current spreading layer.

18 Claims, 9 Drawing Sheets

COMPOUND SEMICONDUCTOR LIGHT EMITTER AND A METHOD FOR MANUFACTURING THE SAME

This application is a divisional of copending U.S. application Ser. No. 08/871,401, filed Jun. 5, 1997, now U.S. pat. No. 5,977,566.

BACKGROUND OF THE INVENTION

1. Technical Field

The present invention generally relates to a light emitting device and, more particularly, to a structure and a method for manufacturing electrodes for such light emitting devices.

2. Description of the Related Art

Many types of light emitting elements are used in a wide range of devices such as light emitting diode (LED) displays and vehicle indicators. In particular, gallium nitride-based compound semiconductors such as GaN, InGaN, GaAlN have attracted a great deal of attention for use as materials for light emitting elements, LEDs, laser diodes (LDs), and the like which emit blue light. In the past, it was difficult to manufacture stable blue light emitting elements. However, these gallium nitride-based compound semiconductor materials make it possible to realize blue or green light emitting elements which have stability and strong intensity.

Generally, blue light emitting elements using a gallium nitride-based compound semiconductor are manufactured by growing a gallium nitride-based compound semiconductor layer such as GaN on a sapphire substrate. Since sapphire is an insulator, the electrodes of these elements cannot be formed on the substrate side. Therefore, the electrodes must be located on the compound semiconductor layer side. However, the electrodes block the light emitted from the compound semiconductor layers. Thus, the emitted light is taken out from the substrate side since the sapphire substrate is transparent. When the light emitting element is mounted on a lead frame, the electrodes on the compound semiconductor layer side must contact the lead frame.

The conventional structure of the light emitting elements using the gallium nitride-based compound semiconductor will be described below. FIG. 11 is a cross-sectional view of a conventional blue light emitting element. An N-type GaN buffer layer 3, an N-type GaN layer 5 and a P-type GaN layer 7 are grown on a sapphire substrate 1. P-type GaN layer 7 is partially removed by a conventional etching method to expose a portion of N-type GaN layer 5. An anode 17 is formed directly on the remaining portion of P-type GaN layer 7 and a cathode 9 is formed on the exposed portion of N-type GaN layer 5. Anode 17 and cathode 9 are connected to lead frames 53 by conductive (e.g., silver) paste layers 55a and 55b, respectively. In this light emitting element, light is emitted from the boundary between N-type GaN layer 5 and P-type GaN layer 7 when electrons and holes recombine. The light is reflected by anode 17 and is emitted through sapphire substrate 1.

It is difficult to reduce the size of the light emitting element of FIG. 11 because anode 17 and cathode 9 must be spaced apart sufficiently so that conductive paste layers 55a and 55b do not contact each other and so that N-type GaN layer 5 and P-type GaN layer 7 are not electrically connected together by conductive paste layer 55b at the region indicated by reference number 59 in FIG. 11. This means that the number of chips on a single wafer cannot increased and that the cost of the device can not be reduced. Further, the connections between the lead frames 53 and anode 17 and cathode 9 require high precision when the size is reduced. This inhibits the production of a large quantity of devices.

FIG. 12 is a cross-sectional view, of a conventional GaAs-based compound semiconductor. An N-type GaAs buffer layer 33, an N-type AlGaInP cladding layer 35, an AlGaInP active layer 37, a P-type AlGaInP cladding layer 39, a P-type AlGaAs current spreading layer 57 and a P-type GaAs contact layer 42 are successively formed on an N-type GaAs substrate 31. One electrode 49 is formed on P-type GaAs contact layer 42 and the other electrode 51 is formed on the back side of N-type GaAs substrate 31. In this structure, injected current is spread in P-type AlGaAs current spreading layer 57. Light is emitted from the pnjunction between AlGaInP active layer 37 and P-type AlGaInP cladding layer 39 and is output via current spreading layer 57.

Current spreading layer 57 must have considerable thickness. When current spreading layer 57 too thin, the injected current is not spread sufficiently and the light can not be emitted uniformly from the pn junction. In addition, current passes under electrode 49 and thus light is emitted from the portion of the pn junction under electrode 49. However, this light is blocked by electrode 49 and thus this light emitting device has a lowered light intensity.

Japanese Laid Open 7-131070 discloses an electrode structure for a light emitting device. The disclosed device is LED array type and has deep grooves around each light emitting region to isolate the pn junctions. The electrode of each light emitting region has a metal layer and a transparent conductive layer so that the electrode is able to form an ohmic contact to compound semiconductors. This electrode has a high transmittance for the wavelength of the emitted light. However, this structure does not effectively protect the pn junctions from the mesa etching to form the deep grooves. Therefore, the device has a lowered quality.

SUMMARY OF THE INVENTION

In accordance with one aspect of the present invention, a compound semiconductor light emitting element includes a light emitting region formed by a pn-junction between a first compound semiconductor layer of a first conductivity type and a second compound semiconductor layer of a second conductivity type; a first electrode connected to the first compound semiconductor layer and isolated from the second compound semiconductor layer; a current spreading layer formed on the second compound semiconductor layer; a block formed on the second compound semiconductor layer; and a second electrode formed on the block and connected to the current spreading layer.

In accordance with another aspect of the present invention, a compound semiconductor light emitting element includes a substrate; a first compound semiconductor layer of a first conductivity type formed on the substrate; a second compound semiconductor layer of a second conductivity type formed on the first compound semiconductor layer; a first electrode formed on the first compound semiconductor layer, the first electrode being isolated from the second compound semiconductor layer; a current spreading layer formed on the second compound semiconductor layer; a block formed on the second compound semiconductor layer; and a second electrode on the block and on a portion of the current spreading layer. The first and the second conductive compound semiconductor layers may be $In_xGa_yAl_zN$ ($x+y+z=1$, $0 \leq x, y, z \leq 1$) layers. A protective layer may be formed on the current spreading layer except for the second electrode.

In accordance with still another aspect of the present invention, a compound semiconductor light emitting element includes a conductive substrate; a first electrode formed on a first surface of the substrate; a first compound semiconductor layer of a first conductivity type on a second surface of the substrate which is opposite to the first surface of the substrate; a second compound semiconductor layer of a second conductivity type formed on the first compound semiconductor layer; a current spreading layer formed on the second compound semiconductor layer; a block formed on the second compound semiconductor layer; and a second electrode formed on the block and on a portion of the current spreading layer. A protective layer may be formed on the current spreading layer except for the second electrode.

In accordance with yet another aspect of the present invention, a method for manufacturing a compound semiconductor light emitting element includes the steps of: forming a first compound semiconductor layer of a first conductivity type on a substrate; forming a second compound semiconductor layer of a second conductivity type; forming a first electrode on the first compound semiconductor layer, the first electrode being isolated from the second compound semiconductor layer; forming a current spreading layer on the second compound semiconductor layer; forming a block on the second compound semiconductor layer adjacent to the current spreading layer; and forming a second electrode which is electrically connected to the current spreading layer. A protective layer may be formed on the current spreading layer.

These and other features and advantages of the present invention will be better understood from a reading of the following detailed description in conjunction with the accompanying drawings.

DETAILED DESCRIPTION

Figure 1A:
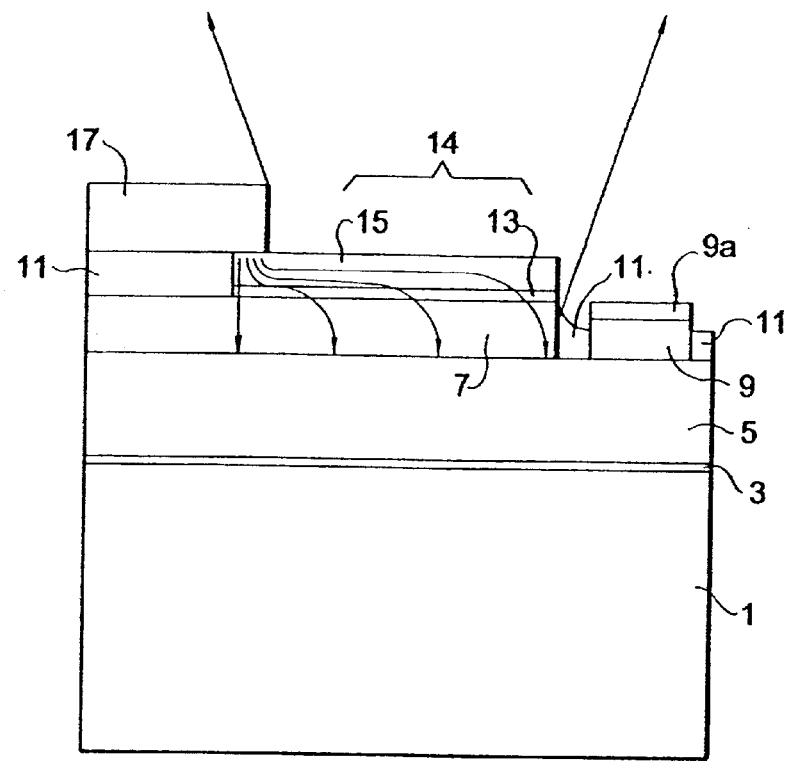
FIG. 1(A) is a cross-sectional view showing the structure of a gallium nitride-based compound semiconductor light emitting element in accordance with a first embodiment of the present invention.
Figure 1B:
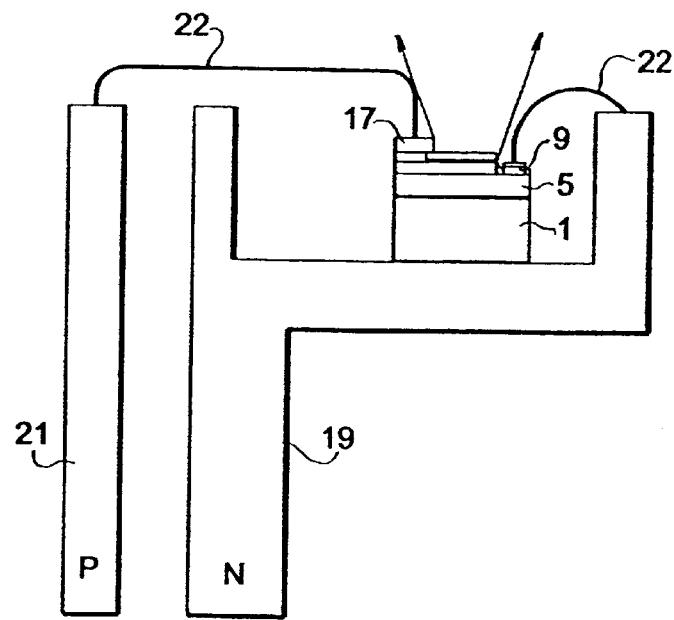
FIG. 1(B) is a cross-sectional view showing the light emitting element of FIG. 1(a) mounted on a cup-type lead frame.

FIG. 1(A) is a cross-sectional view showing the structure of a light emitting element using a gallium nitride-based compound semiconductor in accordance with a first embodiment of the present invention. FIG. 1(B) is a cross-sectional view illustrating the light emitting element of FIG. 1(A) mounted on a cup-type lead frame. Although the structure of this first embodiment can be applied to light emitting elements of all types, this structure is especially appropriate for light emitting elements which emit blue light.

The light emitting element of FIG. 1(A) includes an N-type GaN buffer layer 3 formed on a sapphire substrate 1, an N-type GaN layer 5 formed on buffer layer 3, and a P-type GaN layer 7 formed on N-type GSN layer 5. A cathode 9 is formed on a portion of N-type GaN layer 5 which has been exposed by partially etching P-type GaN layer 7. A current spreading layer 14, which comprises a thin metal layer 13 and a transparent conductive layer 15, and an insulating block 11 are formed on P-type GaN layer 7. An anode 17 is formed on insulating block 11 and on a part of current spreading layer 14.

Current spreading layer 14 needs (1) to form an ohmic contact to P-type GaN layer 7 to function as a contact to anode 17, and (2) to have a low sheet resistance to spread injected electrons over the whole area. Current spreading layer 14 includes two layers: agent layer 13 and transparent conductive layer 15. Agent layer 13 is formed by a magnesium layer having a thickness of about 1 nanometer and a nickel layer having a thickness of about 2 nanometers and makes an ohmic contact between P-type GaN layer 7 and transparent conductive layer 15. Agent layer 13 can be formed using other metals such as Pd, Pt or alloys thereof. Transparent conductive layer 15 is formed of, for example, Indium Tin Oxide (ITO) and has a thickness of about 200 nanometers.

Current spreading layer 14 may include a second agent layer (not shown) formed on transparent conductive layer 15 below anode 17. The second agent layer forms a good ohmic contact to anode 17 and improves the adhesion to anode 17. The second agent layer is made from a metal such as Ni, Mo, Ti, W, Cr or an alloy thereof and has a thickness of less than about 100 nanometers. It is preferable that the thickness of the second agent layer is about 20 nanometers.

Insulating block 11 is formed under anode 17. Insulating block 11 electrically isolates P-type GaN layer 7 from anode 17 and prevents a direct current from flowing between P-type GaN layer 7 and anode 17. Because anode 17 is opaque, light emitted under anode 17 is blocked. Insulating block 11 protects the current injected into a part of P-type GaN layer 7 under anode 17 so that the current is spread to the rest of P-type GaN layer 7 efficiently. Thus, the intensity of the light emitting element increases.

Anode 17 has sufficient thickness to be connected to a bonding wire. If a part of current spreading layer 14 were bonded to the bonding wire directly, current spreading layer 14 would be removed from P-type GaN layer 7 by the tension of the bonding wire. By providing the anode 17, the manufacturing yield of light emitting devices can be increased.

Figure 2A:
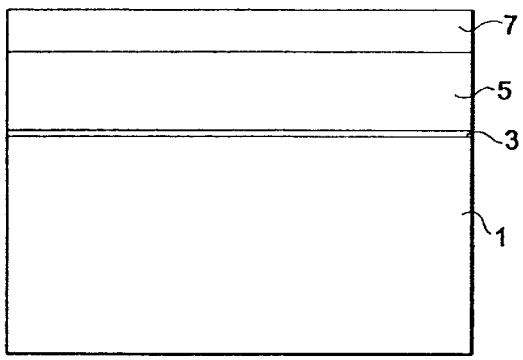
FIGS. 2(A)–2(D) are cross-sectional views showing a process for manufacturing the light emitting element of FIG. 1(A).
Figure 2B:
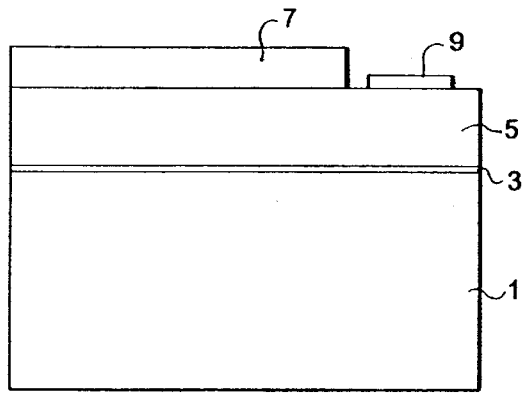

FIGS. 2(A)–2(D) are cross sectional views which illustrate a method of manufacturing the device shown in FIG. 1(A). As shown in FIG. 2(A), a thin GaN buffer layer 3 and an N-type GaN layer 5 (doped with silicon, for example) are grown continuously on a sapphire substrate 1 using molecular beam epitaxy (MBE). A P-type GaN layer 7 (doped with magnesium, for example) is then grown on N-type GaN layer 5 by MBE. With reference to FIG. 2(B), a portion of the surface of N-type GaN layer, is exposed by a conventional etching method such as a photo engraving process (PEP). A cathode 9 is formed on the exposed surface portion of N-type GaN layer 5 using a lift-off method after the vacuum evaporation of a metal such as Ti or Au or an alloy thereof An annealing process is carried out at a temperature of about 700° C. for about 20 minutes to form an ohmic contact between N-type GaN layer 5 and cathode 9.

Figure 2C:
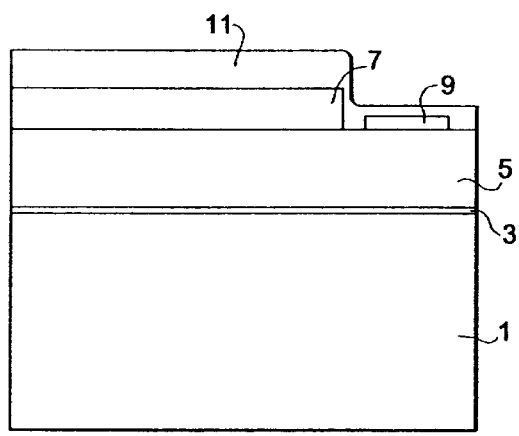
Figure 2D:
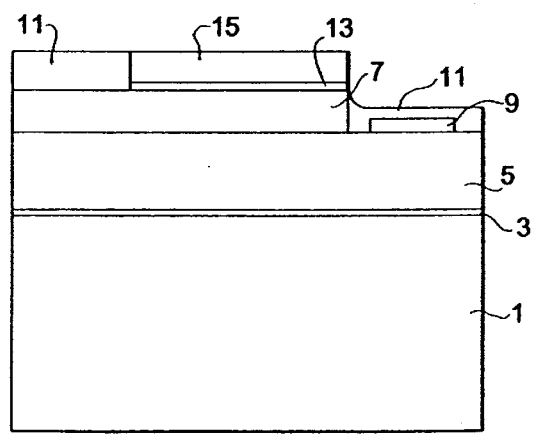

A dielectric layer 11 of silicon dioxide, for example, having a thickness of about 100 nanometers is then deposited on the whole surface of the structure of FIG. 2(B) using chemical vapor deposition (CVD) as shown in FIG. 2(C). Dielectric layer 11 is then etched using a conventional photo engraving process to expose a portion of P-type GaN layer 7. With reference to FIG. 2(D), an agent layer 13 is formed on the exposed portion of P-type GaN layer 7 by the vacuum evaporation of one or more metals, e.g., magnesium having a thickness of about 1 nanometer and nickel having a thickness of about 2 nanometers. A transparent conductive layer 15 of ITO having a thickness of about 200 nanometers is formed on the agent layer 13 by RF sputtering. To improve the ohmic contact, annealing is then carried out at about 400° C. for about 10 minutes.

An anode 17 of Ti, Ni, Au or an alloy thereof is formed on the remaining block of dielectric layer 11 and on a portion of current spreading layer 14. Anode 17 preferably overlaps onto current spreading layer 14 by about 5 micrometers. It is noted that in some instances, the portion of dielectric layer 11 formed on cathode 9 may be removed. In this case, cathode 9 will further include a layer 9a of the material used to form anode 17 (see FIG. 1(A)). Finally, as shown in FIG. 1(B), the sapphire substrate 1 of the light emitting element is glued onto a lead frame 19. Anode 17 and cathode 9 are connected to the ends 21 and 19 of the lead frame, respectively.

An ITO layer cannot be formed directly on P-type GaN layer 7 since ITO includes the N-type dopant tin (Sn). In the present embodiment, agent layer 13 which includes magnesium (Mg) is formed on P-type GaN layer 7. This thickness of agent layer 13 provides 70% of the transmittance for the emitted light. Transparent conductive layer 15 is formed on agent layer 13 to decrease the sheet resistance of current spreading layer 14. Therefore, current spreading layer 14 is in ohmic contact with P-type GaN layer 7 because of agent layer 13. By forming anode 17 mainly on the remaining block of dielectric layer 11, removal of the current spreading layer due to bonding wire tension can be prevented, thereby increasing the manufacturing yield of the light emitting element. The anode 17 and the cathode 9 can be a combination of gold (Au) and one or more metals such as platinum (Pt), titanium (Ti), palladium (Pd) and the like.

Light is emitted from the anode side of the structure of the first embodiment of the present invention. Therefore, the light emitting element can be mounted on a cup-type lead frame 19 which can concentrate the emitted light.

Further, it is easy to arrange bonding points because anode 17 and cathode 9 are located on the same side of the light emitting element. In addition, since transparent conductive layer 15 prevents agent layer 13 from being evaporated during the annealing process for improving ohmic contact, the thickness of agent layer 13 is very controllable and the I-V characteristics of the element are good.

Figure 3A:
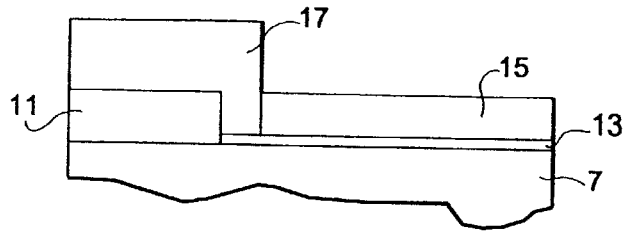
FIGS. 3(A)–3(C) are cross sectional views showing variations of the light emitting element of FIG. 1(A).
Figure 3B:
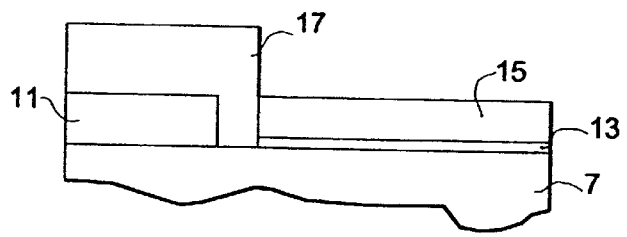
Figure 3C:
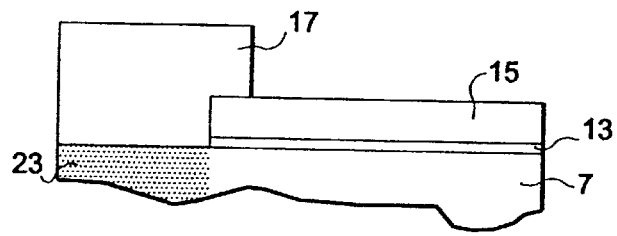
Figure 4:
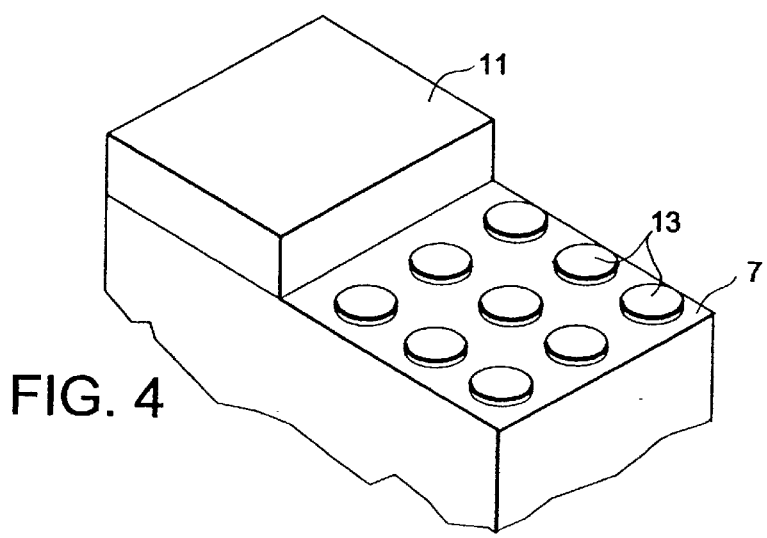
FIG. 4 is a perspective view showing a variation of the shape of the thin metal layer 13 of the light emitting element of FIG. 1(A).

The arrangement of dielectric block 11, agent layer 13, transparent conductive layer 15 and anode 17 is not limited to the arrangement described above, but can be varied as shown, for example, in FIGS. 3(A)–3(C). For example, anode 17 may be formed to be in contact with agent layer 13 as shown in FIG. 3(A) or in contact with P-type GaN layer 7 as shown in FIG. 3(B). Alternatively, as shove in FIG. 3(C), dielectric layer 11 may be omitted and the portion of P-type GaN layer 7 under anode 17 may constitute a high resistance region 23. High resistance region 23 is formed by, for example, selectively implanting impurities into P-type GaN layer 7 prior to forming anode 17. With reference to FIG. 4, agent layer 13 can comprise a plurality of island shaped portions. A metal layer comprising such island-shape portions can also effectively scatter current.

Figure 7:
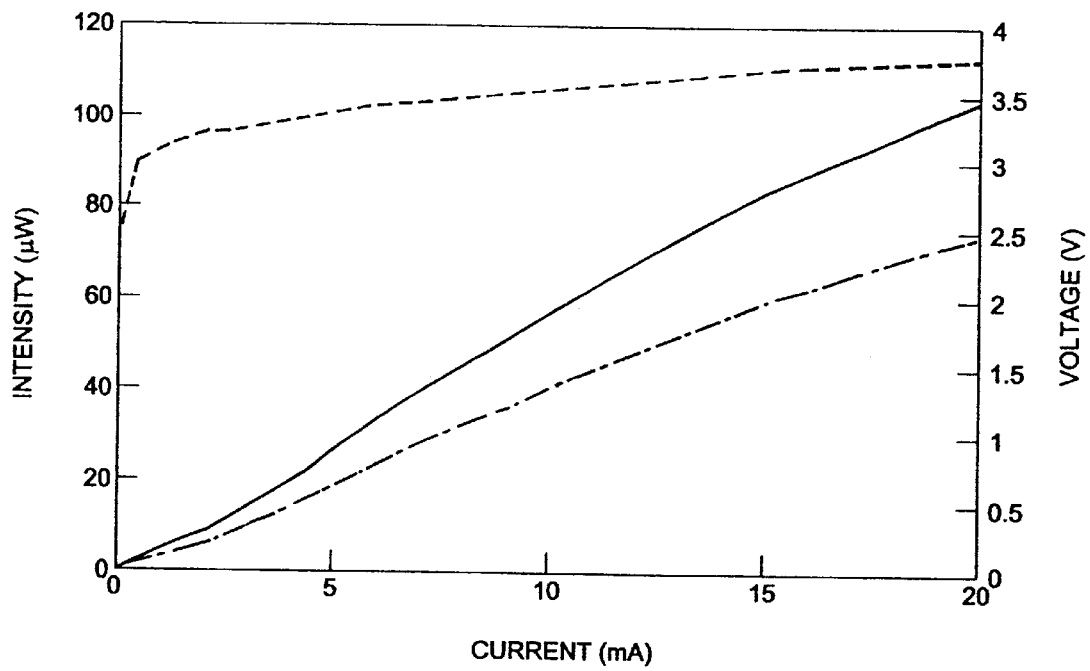
FIG. 7 is a graph showing current versus voltage and current versus intensity of the emitted light.
Figure 11:
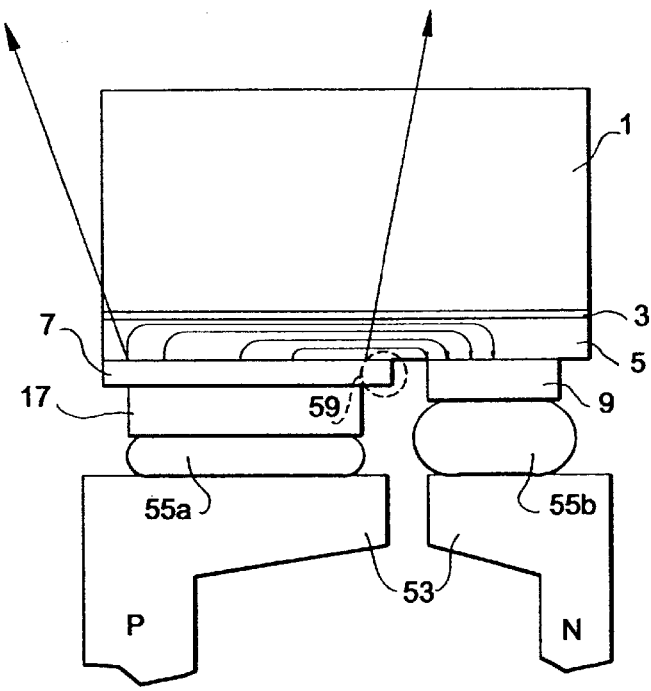
FIGS. 11 and 12 are cross-sectional views showing prior art light emitting elements.

FIG. 7 is a graph showing the current versus voltage characteristics and the current versus intensity characteristics of light emitting by the light emitting element of FIG. 1 as compared to the conventional light emitting element of FIG. 11. The dashed line represents the I-V characteristics both of the light emitting element of FIG. 1 and the conventional light emitting element of FIG. 11. The solid line represents the light intensity versus current characteristics of the light emitting element of FIG. 1 and the dot-dashed line represents the light intensity versus current characteristics of the conventional light emitting element of FIG. 11. As can be seen with reference to FIG. 7, in both the light emitting elements of FIGS. 1 and 11, a current of 20 mA flows when the device is impressed with a voltage of 3.8 V. However, the output of the light emitting element of FIG. 1 is 100 microwatts, but only 70 microwatts for the light emitting element of FIG. 11. Thus, the intensity of the light for the light emitting element of the present invention is increased by about 40% as compared to the conventional light emitting element. The variations of the I-V and light intensity characteristics are very small across the elements formed on a single semiconductor wafer. The yield of the light emitting element of the present embodiment is more than 90%.

Although GaN is used in this embodiment, it is possible to use $In_xGa_yAl_zN(x+y+z=1, 0 \leq x, y, z \leq 1)$. In addition, although nickel is used as agent layer 13 in this embodiment, it is possible to use materials which have the same dopant as, the P-type GaN layer 7 such as AuBe or AuMg. Further, agent layer 13 can be a multi-layer arrangement of Ni, Au, Zn, Ti or alloys thereof to improve adhesion to the agent layer 13. Similarly, transparent conductive layer 15 is not limited to ITO. Other suitable materials for dielectric layer 11 include $SiN_x$, $Al_2O_3$, $TiO_2$, $ZrO_2$, $Ta_2O_5$, $HfO_2$, or polyimide.

The sinter process to form the ohmic contact between agent layer 13 and P-type GaN layer 7 can be carried out after forming agent layer 13 or after forming transparent conductive layer 15.

Because the dielectric block 11 is formed under anode 17, current is scattered to the entire area of the emitting light plane. Therefore, the light emitting element of the present invention can emit more light than the conventional type. Because a thick current spreading layer is not necessary, the efficiency and the cost to manufacture the device is improved. Finally because the light is emitted from the electrode side, opaque materials may be used for the substrate 1.

FIGS. 5(A)–5(E) are cross-sectional views showing a process of manufacturing a GaAs fight emitting element in accordance with a second embodiment of the present invention. Although the structure of this second embodiment can be applied to light emitting elements of all types, this structure is especially appropriate for light emitting devices which emit green light or light with a wavelength longer than the wavelength of green light.

Figure 5A:
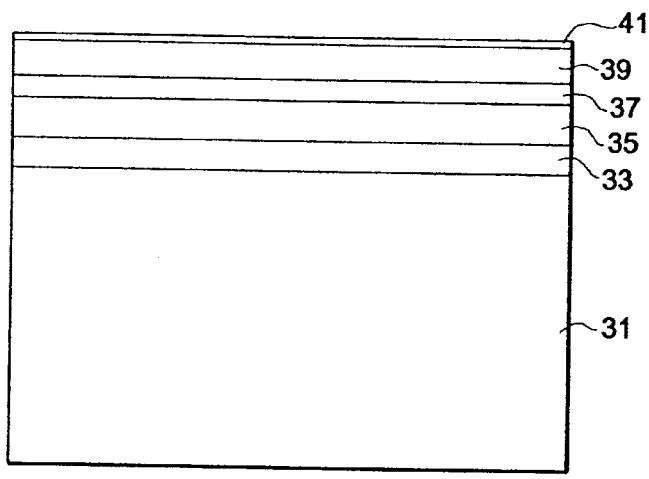
FIGS. 5(A)–5(E) are cross-sectional views showing a process for manufacturing a GaAs light emitting element in accordance with a second embodiment of the present invention.
Figure 5B:
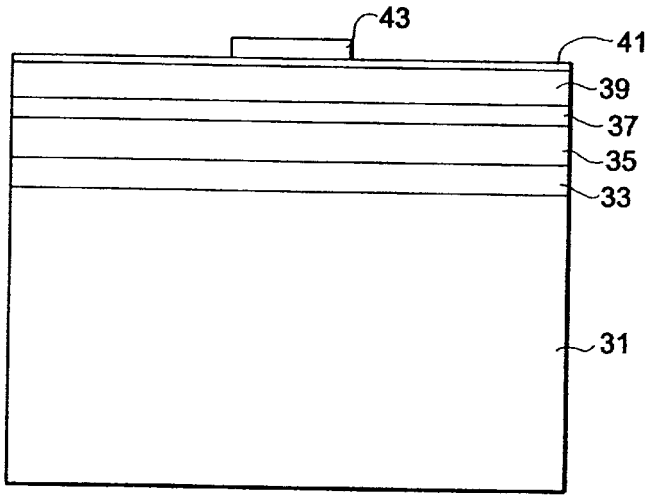
Figure 5C:
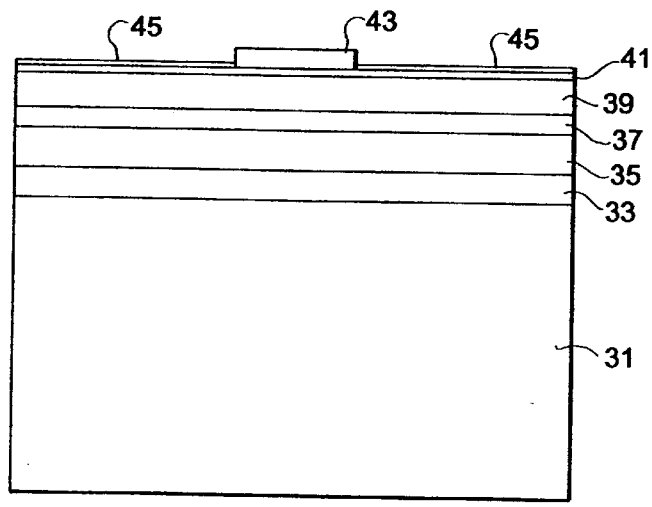
Figure 5D:
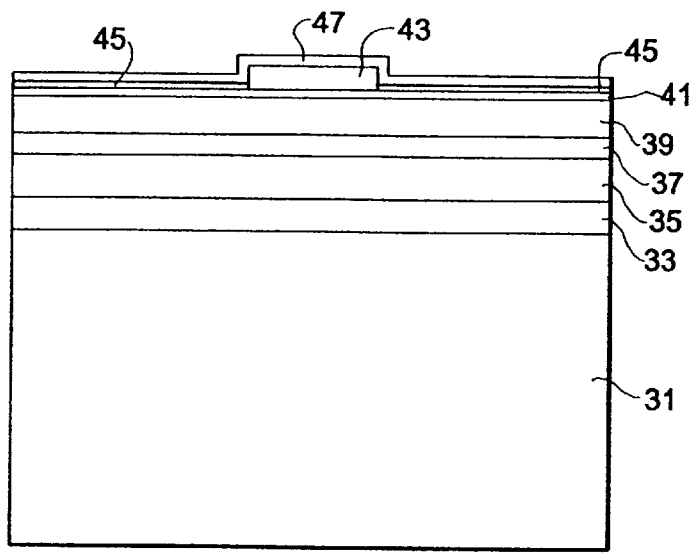
Figure 5E:
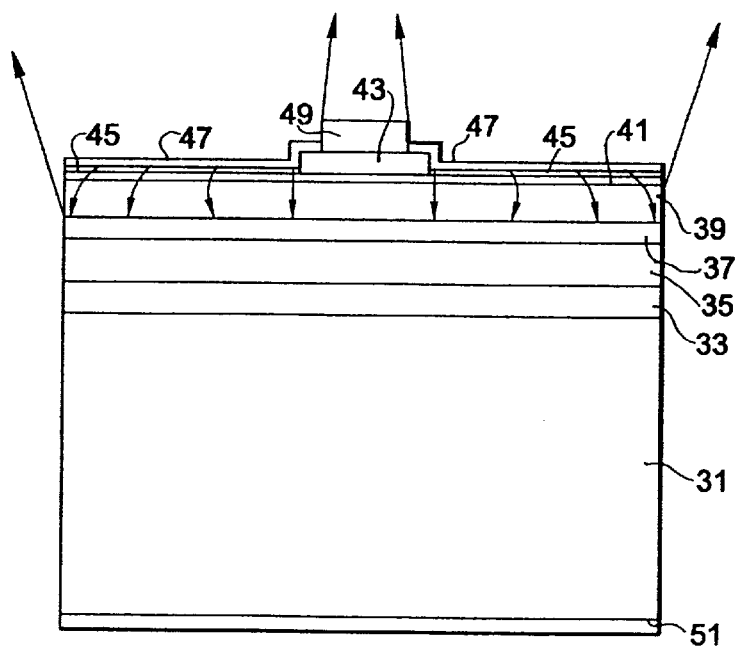

With reference to FIG. 5(A), an N-type GaAs buffer layer 33, an N-type AlGaInP cladding layer 35, an AlGaInP active layer 37, a P-type AlGaInP cladding layer 39 and a P-type GaAs contact layer 41 (doped with zinc, for example) are grown on an N-type GaAs substrate 31. A block 43 of N-type AlGaInP or N-type GaAs is formed on the P-type GaAs contact layer 41 as shown in FIG. 5(B). An agent layer 45, made of a thin metal layer having a thickness of about 5 nanometers and which contains P-type dopant (e.g. AuZn), is then deposited on the P-type GaAs contact layer 41, but not on block 43, through a sinter process at about 430° C. for about 15 minutes as shown in FIG. 5(C). A transparent conductive layer 47 (of ITO, for example) is formed on the whole surface of the structure of FIG. 5(C) as shown in FIG. 5(D). A portion of transparent layer 47 on block 43 is then removed by an etching method and an anode 49 is formed on the block 43 in contact with transparent conductive layer 47. Cathode 51 is then formed on the back side of N-type GaAs substrate 31 as shown in FIG. 5(E).

Block 43 formed by N-type AlGaInP or N-type AlGaAs prevents current from being injected into the area of P-type GaAs contact layer 41 directly under anode 49 because there is a high impedance pn-junction between the block 43 and P-type GaAs contact layer 41.

Thin metal agent layer 45 and transparent conductive layer 47 constitute the current spreading layer. The current is spread in the current spreading layer and is effectively conducted to AlGaInP active layer 37, so the light is uniformly emitted between AlGaInP active layer 37 and P-type AlGaInP cladding layer 39.

Figure 12:
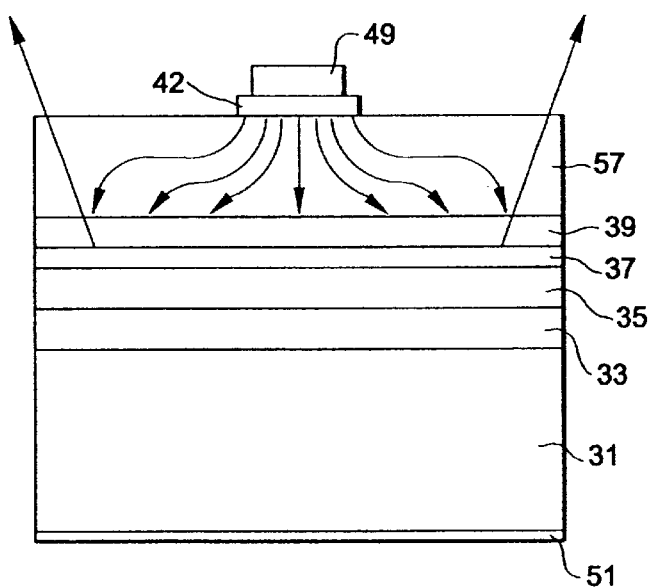

Since block 43 is made from a GaAs-based compound semiconductor, conventional processes may be used and a thick P-type AlGaAs current spreading layer of the conventional devices, as shown in FIG. 12, is not needed. Thus, it becomes easy to manufacture the light emitting elements and to decrease the manufacturing cost.

Figure 6A:
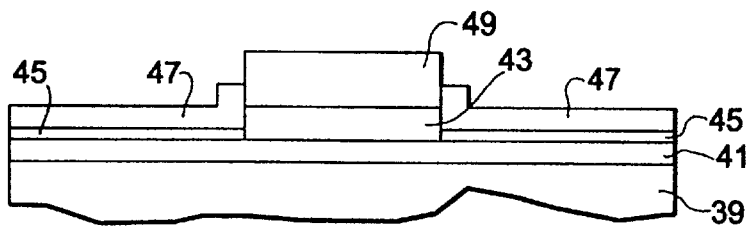
FIGS. 6(A)–6(D) are cross-sectional views showing variations of the light emitting element of FIGS. 5(A)–5(E).
Figure 6B:
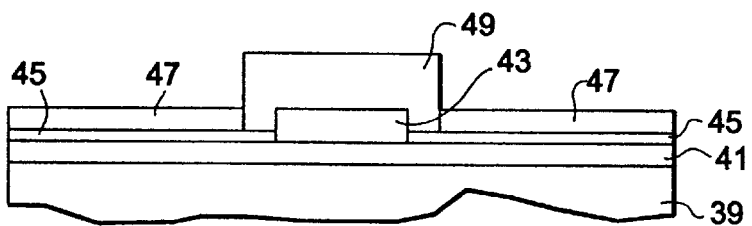
Figure 6C:
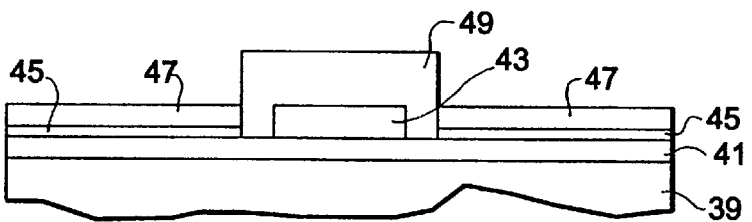
Figure 6D:
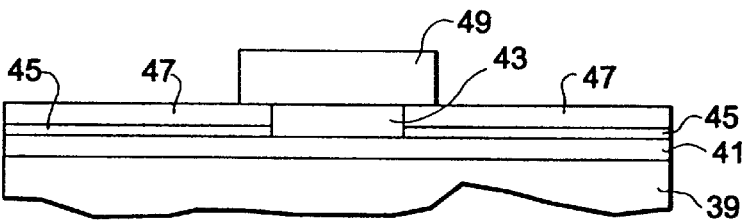

The arrangement of block 43, agent layer 45, transparent conductive layer 47 and anode 49 is not limited to the arrangement described above, but can be varied as shown, for example, in FIGS. 6(A)–6(D). As shown in FIG. 6(A), transparent conductive layer 47 may be etched so as to expose the entire upper surface of block 43 and anode 49 may be formed on this entire exposed surface. Transparent conductive layer 47 may be etched so, as to expose block 43 and a portion of agent layer 45. In this way, as shown in FIG. 6(B), anode 49 may then be formed to contact block 43 and the exposed portion of agent layer 45. Transparent conductive layer 47 may be etched so as to expose block 43 and a portion of agent layer 45 and then agent layer 45 may be etched so as to expose a portion of contact layer 41. In this way, as shown in FIG. 6(C), anode 49 may then be formed to contact block 43, agent layer 45, and contact layer 41. As shown in FIG. 6(D), anode 49 may be formed on block 43 and on transparent conductive layer 47.

Buffer layer 33 and contact layer 41 may be formed of other materials such as AlGaAs. Block 43 can be made of dielectric layers such as silicon dioxide, as well as N-type AlGaInP or N-type AlGaAs. Agent layer 45 can also include island-shaped portions as shown in FIG. 4. Although AuZn is used as the agent layer 45 in this embodiment, other materials having the same dopant as P-type GaAs layer 41 may also be used. For example, AuBe, AuMg, AuGe may be used. Agent layer 45 can also have a multi-layer structure of Ni, AuZn, Ti or alloys thereof to improve adhesion to the agent layer 45. The transparent conductive layer 47 is not limited to ITO.

The sinter process to form the ohmic contact between agent layer 45 and P-type GaAs layer 41 can be carried out after forming agent layer 45 or after forming the transparent conductive layer 47.

Because block 43 is formed under anode 49, the current is spread to the whole area of the light emitting plane. Therefore, the light emitting, element of he present invention can emit more light that conventional light emitting elements. Further, because a thick current spreading layer is not necessary, the efficiency and the cost to manufacture the device is improved.

Figure 8:
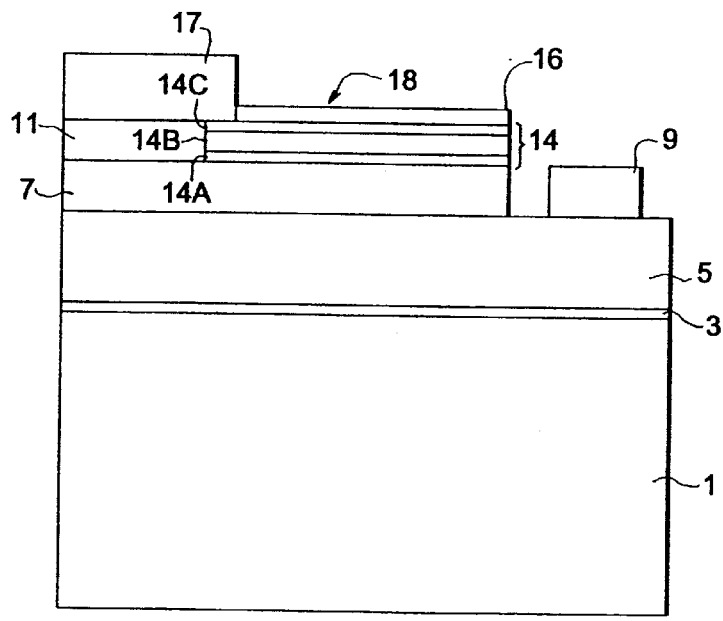
FIG. 8 is a cross-sectional view showing a light emitting element in accordance with a third embodiment of the present invention.

FIG. 8 is a cross-sectional view of a light emitting element in accordance with a third embodiment of the present invention. The light-emitting element of FIG. 8 uses a gallium nitride-based compound semiconductor. Although the structure of this third embodiment can be applied to light emitting elements of all types, this structure is especially appropriate for light emitting devices which emit blue light.

Similar to the embodiment of FIG. 1, the light emitting element of FIG. 8 includes an N-type GaN layer 5 having a thickness of about 4 micrometers formed on an N-type GaN buffer layer 3 which is formed on a sapphire substrate 1. A P-type GaN layer 7 having a thickness of about 0.3–0.5 micrometers is formed on N-type GaN layer 5. A cathode 9 is formed on a portion of N-type GaN layer 5 which has been exposed by partially etching P-type GaN layer 7. A current spreading layer 14 having a thickness of about 10–60 nanometers and a dielectric block 11 having a thickness of about 100 nanometers are formed on the remaining portion of P-type GaN layer 7. An anode 17 having a thickness of about 1 micrometer is formed on dielectric block 11 and on a part of current spreading layer 14. The portion of current spreading layer 14 which is not covered by anode 17 is covered by a protective layer 16 (e.g., silicon dioxide) having a thickness of about 220 nanometers.

Like the device of FIG. 1(A), sapphire substrate 1 of the light emitting element of FIG. 8 is glued on a lead frame, and anode 17 and cathode 9 are bonded to ends of the lead frame.

Current spreading layer 14 needs (1) to form an ohmic contact to P-type GaN layer 7 to function as a contact to anode 17; (2) to have a low sheet resistance to spread the injected electrons over the whole current spreading layer area; (3) to adhere to protective layer 16; and (4) to be thin enough to pass the light emitted from the pn junction between N-type GaN layer 5 and P-type GaN layer 7. In this case, current spreading layer 14 may, for example, include three layers. The first layer 14A is an agent layer made from metal such as nickel (Ni) which makes ohmic contact to P-type GaN layer 7. The second layer 14B is made from a metal which has a low sheet resistance (e.g. Au). The third layer 14C is made from a metal (e.g., Ni) which can adhere to protective layer 16. Each of the layers, 14A, 14B and 14C has a thickness less than 20 nanometers.

Protective layer 16 performs two important functions. First, protective layer 16 prevents current spreading layer 14 from evaporating and becoming thinned during an anneal step to adhere current spreading layer 14 to P-type GaN layer 7. In this way, the thickness of the current spreading layer 14 can be strictly controlled so that there is no increase of the sheet resistance of current spreading layer 14 during the anneal step. Second, protective layer 16 has a refractive index between the refractive index of current spreading layer 14 and the region 18 into which light from protective layer 16 is emitted. Region 18 which may be air or the resin of a package into which the light emitting device is incorporated. In this way, protective layer 16 can effectively radiate the light emitted at the pn-junction between N-type GaN layer 5 and P-type GaN layer 7. Protective layer 16 decreases the difference in the refractive index between P-type GaN layer 7 and region 18, so that the light from P-type GaN layer 5 can be radiated through current spreading layer 14 and protective layer 16 effectively.

The light emitted under anode 17 cannot be radiated because anode 17 is opaque. Dielectric block 11 which is formed under anode 17 electrically isolates P-type GaN layer 7 from anode 17 and blocks the current into P-type GaN layer 7 under anode 17. The current passes to the area not under anode 17, so that the current is not wasted under anode 17. Thus, the intensity of the light emitting element increases.

Anode 17 has a thickness which is sufficient to permit connection to bonding wire 22. One purpose of anode 17 is to ensure good contact with bonding wire 22. If current spreading layer 14 were directly bonded to bonding wire 22, current spreading layer 14 would be removed from P-type GaN layer 7 by the tension of bonding wire 22. Thus, anode 17 permits an increase in the yield of the light emitting devices.

The manufacturing process for manufacturing the light emitting device of FIG. 8 will now be described. With reference to FIG. 8, a thin GaN buffer layer 3 and an N-type GaN layer 5 are grown continuously on a sapphire substrate 1 using molecular beam epitaxy (MBE). A P-type GaN layer 7 is grown on N-type GaN layer 5 by MBE.

P-type GaN layer 17 is etched by a conventional photo etching method to expose a portion of the surface of N-type GaN layer 5. A cathode 9 is then formed on the exposed portion of N-type GaN layer 5 using the lift-off method after the vacuum evaporation of a metal such as titanium (Ti) or gold (Au). In order to make an ohmic contact between N-type GaN layer 5 and cathode 9, an anneal process is carried out at a temperature of about 700° C. for about 20 minutes. A dielectric layer 11 of, for example, silicon dioxide is deposited on the whole surface using CVD. Dielectric layer 11 is then etched using a conventional photo engraving process to leave a dielectric block portion.

Current spreading layer 14 is formed by the vacuum evaporation of one or more metals. In the embodiment of FIG. 8, current spreading layer 14 includes three layers. For example., a nickel (Ni) layer, a gold (Au) layer, and a nickel (Ni) layer are formed successively. Current spreading layer 14 is shaped using the conventional lift-off method. The first layer 14A of current spreading layer 14, having a thickness of about 3 nanometers, is made from nickel (Ni) which can make a good ohmic contact. The second layer 14B, having a thickness of about 10 nanometers, is made from gold (Au) which has a low sheet resistance. The third layer 14C, having a thickness of about 0.5 nanometer, is made from nickel (Ni) which can adhere to protective layer 16. A protective layer 16, formed of silicon dioxide and having a thickness of about 220 nanometers, is deposited on current spreading layer 14 using thermal CVD.

In order to make ohmic contact between P-type GaN layer 7 and the first layer 14A of current spreading layer 14, an anneal process is carried out at about 500° C. for about 10 minutes. The temperature of the anneal process must be chosen so that the ohmic contact between P-type GaN layer 7 and current spreading layer 14 is not deteriorated by a reaction between P-type GaN layer 7 and current spreading layer 14. When the boundary between P-type GaN layer 7 and current spreading layer 14 is clean enough to form an ohmic contact naturally, the anneal process is not needed.

An area of protective layer 16 for forming an anode 17 and a region for connection to current spreading layer 14 is removed by conventional photo engraving. Anode 17 is formed on the area from which protective layer 16 has been removed by depositing one or more metals (e.g., Ti or Au) and then using the lift-off method. Sapphire substrate 1 of the light emitting element is glued on a lead frame, and anode 17 and cathode 9 are connected to ends of the lead frame.

Current spreading layer 14, cathode 9 and anode 17 can be a combination of gold (Au) and one or more metals such as platinum (Pt), titanium (Ti), paladium (Pd), and nickel (Ni). Although current spreading layer 14 of the embodiment of FIG. 8 includes three layers made from titanium (Ti), gold (Au) and nickel (Ni), these layers can be made from other materials such Ni, Au and Ti. In addition, current spreading layer 14 may include more than three layers. Protective layer 16 may be formed of materials other than silicon dioxide such as $SiN_x$, $Al_2O_3$, $TiO_2$, $ZrO_2$, $Ta_2O_5$, $HfO_2$ and the like.

Figure 9:
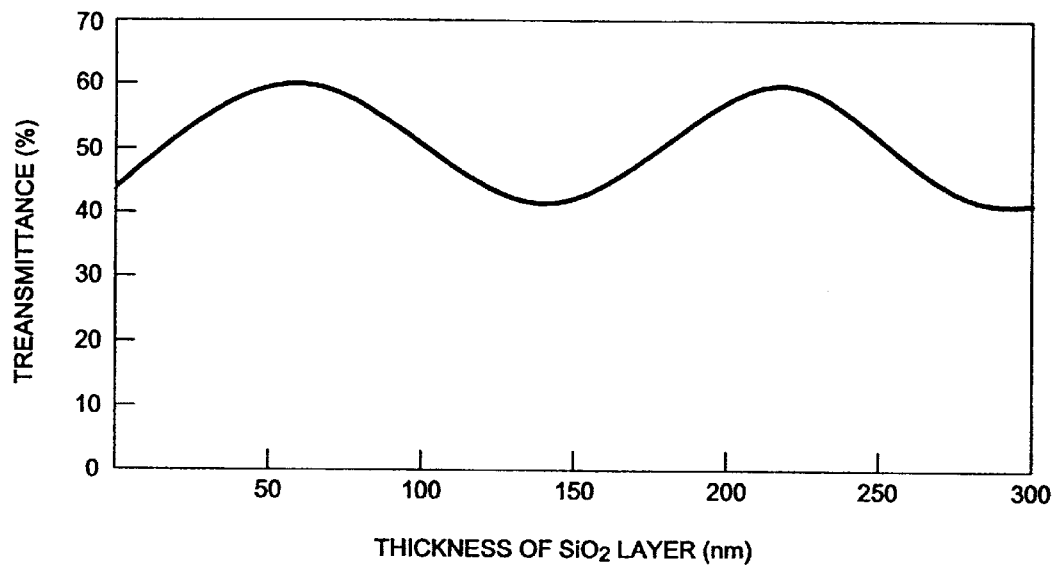
FIG. 9 is a graph showing the relationship between the thickness and the transmittance of the protective layer 16 formed from $SiO_2$.

FIG. 9 is a graph showing the relationship between the thickness of protective layer 16 (formed from silicon dioxide) and the transmittance for light having a wavelength of 450 nanometers. When protective layer 16 has a thickness of 0 nanometers (i.e., no protective layer is present), the transmittance is 43%. On the other hand, when protective layer 16 has a thickness of about 220 nanometers, the transmittance is 60.9%. FIG. 9 demonstrates that the transmittance may be increased by forming protective layer 16 to have a certain thickness.

Figure 10:
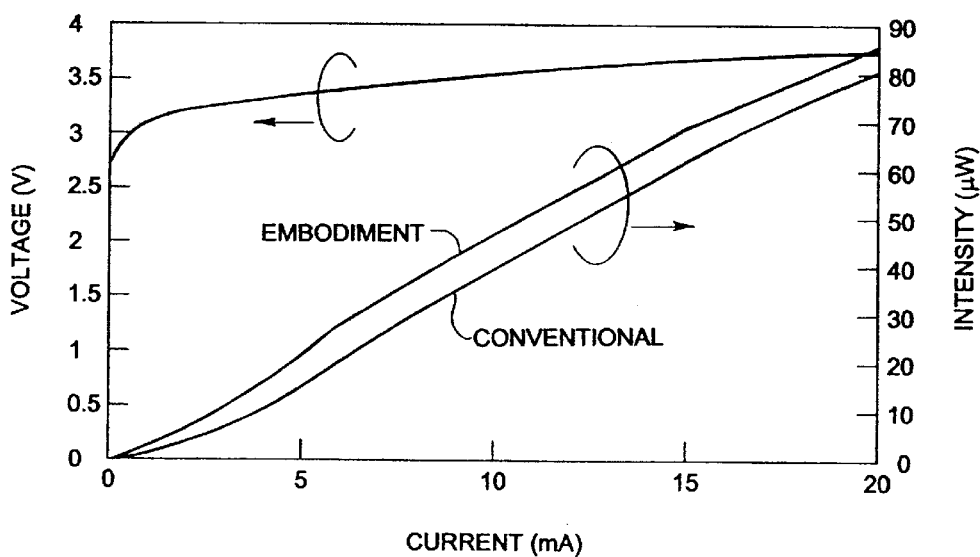
FIG. 10 is a graph showing current versus voltage and current versus intensity of the light emitting element of the third embodiment.

FIG. 10 is a graph showing the relationship of current and the voltage impressed on the light emitting element of the third embodiment and the relationship of current versus the intensity of the light emitted from the light emitting element of the third embodiment. In device of the present invention a current of 20 mA is obtained when the impressed voltage is 3.6V. When the current is 20 mA, the intensity of the light emitted by the device of the present invention is 86 microwatts. In the conventional device, the intensity of the emitted light is about 80 microwatts when the current is 20 mA. Thus, the device of the present invention achieves an increase of 10% in the intensity of the emitted light as compared with the conventional device. Further, the variations of the I-V characteristics and the capacity of the emitting light intensity in the light emitting devices across a single wafer are very small and the manufacturing yield from a wafer is over 90%.

While the present invention has been described above in terms of a light emitting device, the structures of the above embodiments may also be applied to light detecting devices in which photons incident on the device generate a detectable current.

In accordance with the devices of this invention, the problem of the tension of the bonding wire strips on the current spreading layer is eliminated. The present invention includes an anode for bonding which is thick enough for bonding. Thus, the quality of the device of this invention increases.

In addition, the present invention can reduce current and increase the intensity of the emitted light. The present invention has an isolating block under the anode which blocks the light from the pn-junction and the block isolates the anode from the GaN layer so as to prevent the injection of current into the area under the anode. Thus the emission of light under the anode is suppressed, and the current is injected into the remaining area efficiently.

Further, the present invention permits tight control of the thickness of the anode. In particular, the protective layer prevents the evaporation of the current spreading layer during the annealing step.

Still further, the present invention adjusts the refractive index between the current spreading layer and the region into which light is emitted from the device. Because the present invention includes protective layer which has a refractive index between that of the current spreading layer and this region, the difference of the refractive indexes between the current spreading layer and the region is decreased. Therefore the light emitted on the pn-junction is emitted from the protective layer easily.

While there has seen shown and described various embodiments of the present invention it will be evident to those skill in the art that various modification may be made thereto without departing from the scope of the invention which is set forth in the appended claims.

We claim:

1. A compound semiconductor light emitting element comprising:
    a substrate;
    a first compound semiconductor layer of a first conductivity type formed on said substrate;
    a second compound semiconductor layer of a second conductivity type formed on said first compound semiconductor layer;
    a first electrode formed on said first compound semiconductor layer, said first electrode being isolated from said second compound semiconductor;
    a current spreading layer formed on said second compound semiconductor layer;
    a second electrode formed on said second compound semiconductor layer and on a portion of said current spreading layer, at least a portion of said second electrode overlying at least a portion of a junction between said first and second compound semiconductor layers; and
    a block having high electrical resistance formed under said second electrode.

2. A compound semiconductor light emitting element comprising:
    a substrate;
    a first compound semiconductor layer of a first conductivity type formed on said substrate;
    a second compound semiconductor layer of a second conductivity type formed on said first compound semiconductor layer;
    a first electrode formed on said first compound semiconductor layer, said first electrode being isolated from said second compound semiconductor;
    a current spreading layer formed on said second compound semiconductor layer;
    a block formed on said second compound semiconductor layer; and
    a second electrode formed on at least a portion of said block and on at least a portion of said current spreading layer, at least a portion of said second electrode overlying at least a portion of a junction between said first and second compound semiconductor layers.

3. A compound semiconductor light emitting element according to claim 2, wherein said first and said second compound semiconductor layers are $In_xGa_yAl_zN$ ($x+y+z=1$, $0 \leq x \leq 1$, $0 \leq y \leq 1$, $0 \leq z \leq 1$) layers.

4. A compound semiconductor light emitting element according to claim 2, wherein said current spreading layer has an ohmic contact with said second compound semiconductor layer.

5. A compound semiconductor light emitting element according to claim 2, wherein said current spreading layer comprises an agent layer which has an ohmic contact with said second compound semiconductor layer.

6. A compound semiconductor light emitting element according to claim 5, wherein said agent layer comprises a plurality of island-shaped portions formed on said second compound semiconductor layer.

7. A compound semiconductor light emitting element according to claim 5, wherein said agent layer is a metal layer.

8. A compound semiconductor light emitting element according to claim 2, wherein said current spreading layer comprises Indium Tin Oxide (ITO).

9. A compound semiconductor light emitting element according to claim 2, wherein said block is formed of a material selected from a group consisting of $SiO_2$, $SiN_x$, $Al_2O_3$, $TiO_2$, $ZrO_2$, $Ta_2O_5$, $HfO_2$, and polyimide.

10. A compound semiconductor light emitting element according to claim 2, wherein said current spreading layer comprises a first agent layer which has an ohmic contact with the second compound semiconductor layer and a second agent layer which has an ohmic contact with said first electrode.

11. A compound semiconductor light emitting element comprising:
    a substrate;
    a first compound semiconductor layer of a first conductivity type formed on said substrate;
    a second compound semiconductor layer of a second conductivity type formed on said first compound semiconductor layer;
    a first electrode formed on said first compound semiconductor layer, said first electrode being isolated from said second compound semiconductor;
    a current spreading layer formed on said second compound semiconductor layer;
    a block formed on said second compound semiconductor layer, said block sharing an area on said second compound semiconductor layer with said current spreading layer;
    a second electrode formed on at least a portion of said block and on at least a portion of said current spreading layer, at least a portion of said second electrode overlying at least a portion of a junction between said first and second compound semiconductor layers; and
    a lead frame having ends connected to said first electrode and to said second electrode, respectively.

12. A compound semiconductor light emitting element according to claim 11, further comprising:
    a protective layer formed on said current spreading layer.

13. A compound semiconductor light emitting element comprising:
    a conductive substrate;
    a first electrode formed on a first surface of said substrate;
    a first buffer layer of a first conductivity type compound semiconductor formed on a second surface of said substrate which is an opposite surface to the first surface of said substrate;

a first cladding layer of the first conductivity type compound semiconductor formed on said first buffer layer;

an active layer formed on said first cladding layer;

a second cladding layer of a second conductivity type compound semiconductor layer formed on said active layer, wherein said active layer is formed at a junction between said first cladding layer and said second cladding layer;

a contact layer of a second conductivity type compound semiconductor layer formed on said second cladding layer;

a current spreading layer formed on said contact layer;

a block formed on said contact layer, said block overlying at least a portion of said active layer; and a second electrode formed on at least a portion of said block and on a portion of said current spreading layer, at least a portion of said second electrode overlying at least a portion of said active layer, wherein, during operation, light is emitted from at least one side of said active layer.

14. A compound semiconductor light emitting element according to claim 13, wherein said first buffer layer and said contact layer are $Al_xGa_{(1-x)}As(0 \leq x \leq 1)$ layers, and said first cladding layer, said active layer and said second cladding layer are $(Al_xGa_{(1-x)})_yIn_{(1-y)}P(0 \leq x \leq 1, 0 \leq y \leq 1)$ layers.

15. A compound semiconductor light emitting element according to claim 13, wherein said block is formed of a material selected from a group consisting of the first conductivity type compound semiconductor, $SiO_2$, $SiN_x$, $Al_2O_3$, $TiO_2$, $ZrO_2$, $Ta_2O_5$, $HfO_2$ and polyimide.

16. A compound semiconductor light emitting element according to claim 15, wherein said first conductivity type compound semiconductor is the first conductivity type $(Al_xGa_{(1-x)})_yIn_{(1-y)}P(0 \leq x \leq 1, 0 \leq y \leq 1)$ or $Al_xGa_{(1-x)}As (0 \leq x \leq 1)$.

17. A compound semiconductor light emitting element comprising:

a light emitting region formed by a pn-junction between a first compound semiconductor layer of a first conductivity type and a second compound semiconductor layer of a second conductivity type;

a first electrode connected to said first compound semiconductor layer and isolated from said second compound semiconductor layer;

a current spreading layer formed on said second compound semiconductor layer;

a high resistance region formed in a portion of said second compound semiconductor layer; and a second electrode substantially covering said high resistance region and electrically connected to said current spreading layer.

18. The element of claim 13, wherein said block is formed on an inner portion of an upper surface of said contact layer.

* * * * *